(12) United States Patent
Nemoto

(10) Patent No.: US 8,639,133 B2
(45) Date of Patent: Jan. 28, 2014

(54) POWER SUPPLY APPARATUS AND IMAGE FORMING APPARATUS

(75) Inventor: Kenji Nemoto, Suntou-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 928 days.

(21) Appl. No.: 12/628,687

(22) Filed: Dec. 1, 2009

(65) Prior Publication Data

US 2010/0135698 A1 Jun. 3, 2010

(30) Foreign Application Priority Data

Dec. 1, 2008 (JP) ................................ 2008-306502
Nov. 6, 2009 (JP) ................................ 2009-255226

(51) Int. Cl.
*G03G 15/00* (2006.01)
(52) U.S. Cl.
USPC ............................................. 399/37; 399/88
(58) Field of Classification Search
USPC ............. 399/88–90, 168; 310/318; 363/21.12
See application file for complete search history.

(56) References Cited

U.S. PATENT DOCUMENTS

| 3,662,194 A * | 5/1972 | Moriki et al. ................. 310/318 |
| 7,030,538 B2 * | 4/2006 | Nakatsuka et al. ........... 310/312 |
| 2007/0018589 A1 * | 1/2007 | Saito et al. .............. 315/209 PZ |

FOREIGN PATENT DOCUMENTS

| JP | 04156703 A * | 5/1992 |
| JP | 10-047992 | 2/1998 |
| JP | 11-206113 | 7/1999 |
| JP | 2006-108332 | 4/2006 |

* cited by examiner

*Primary Examiner* — David Gray
*Assistant Examiner* — Erika J Villaluna
(74) *Attorney, Agent, or Firm* — Canon USA, Inc. IP Division

(57) ABSTRACT

A power supply apparatus including a current regulation unit configured to regulate a surge current generated on a primary side of a piezoelectric transformer. The surge current is generated when the piezoelectric transformer including a piezoelectric element and a holding unit, which are connected to each other using a conductive rubber, is driven.

14 Claims, 12 Drawing Sheets

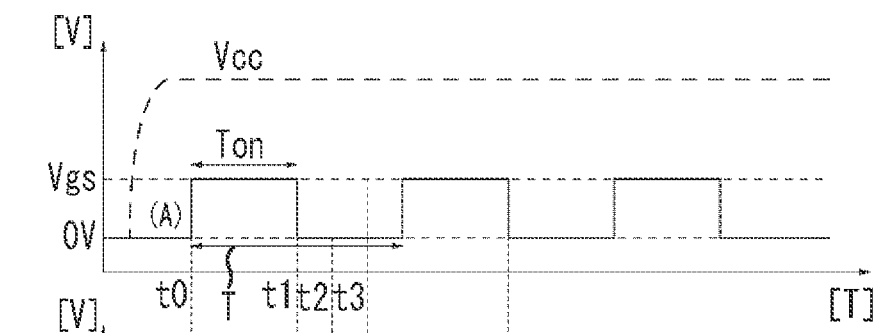
FIG. 2A
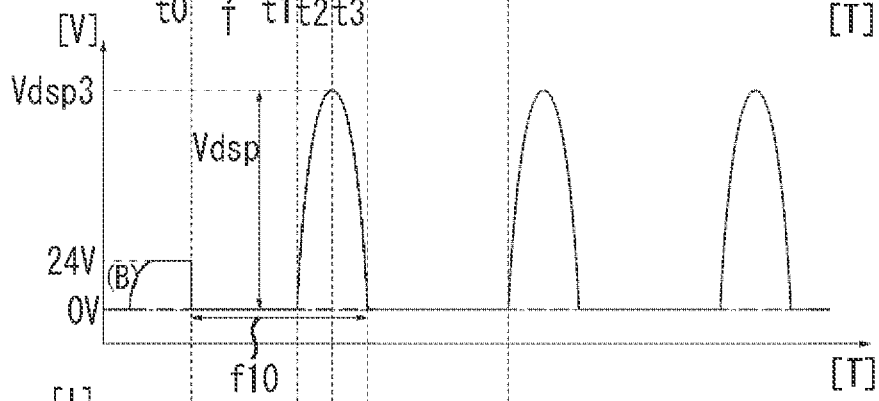
FIG. 2B
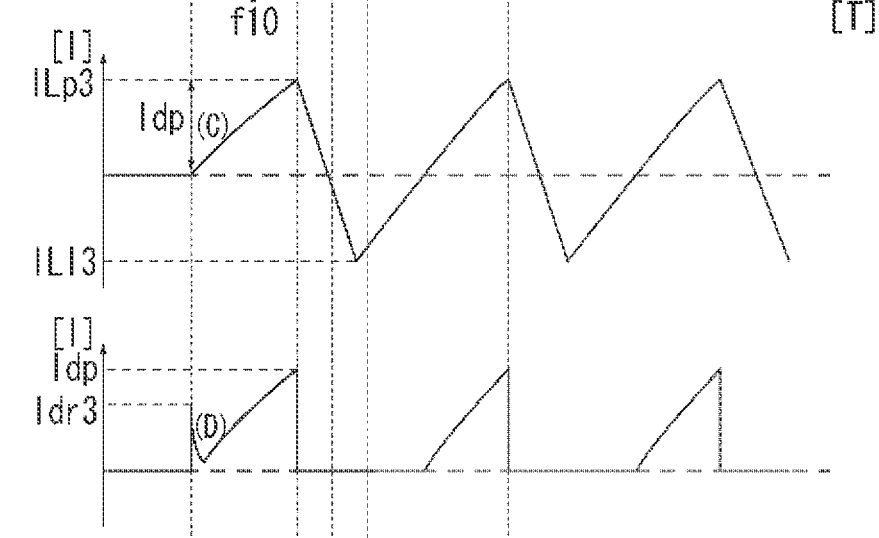
FIG. 2C
FIG. 2D
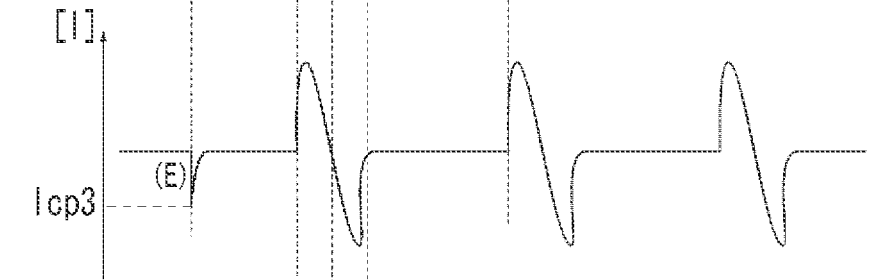
FIG. 2E
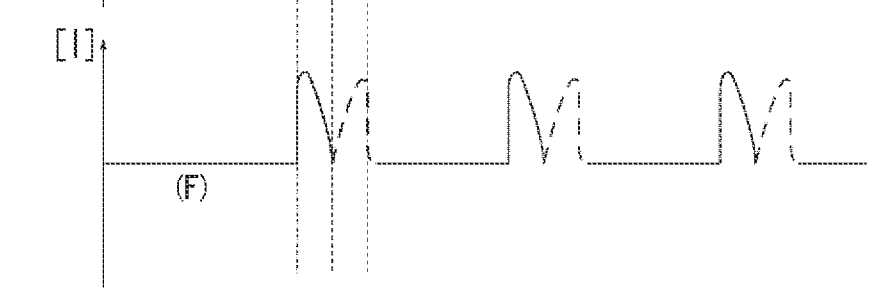
FIG. 2F

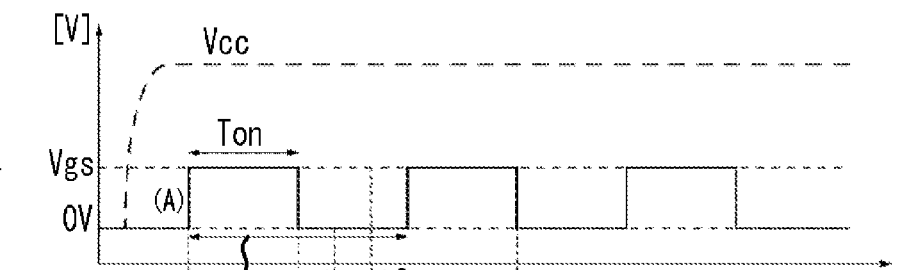
FIG. 7A
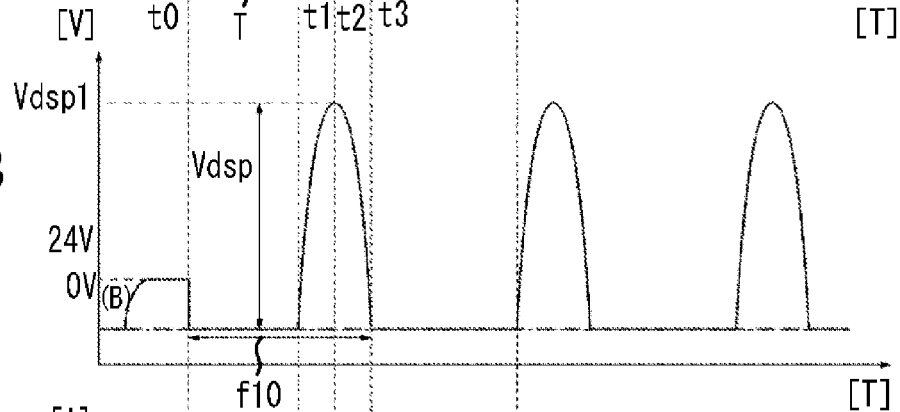
FIG. 7B
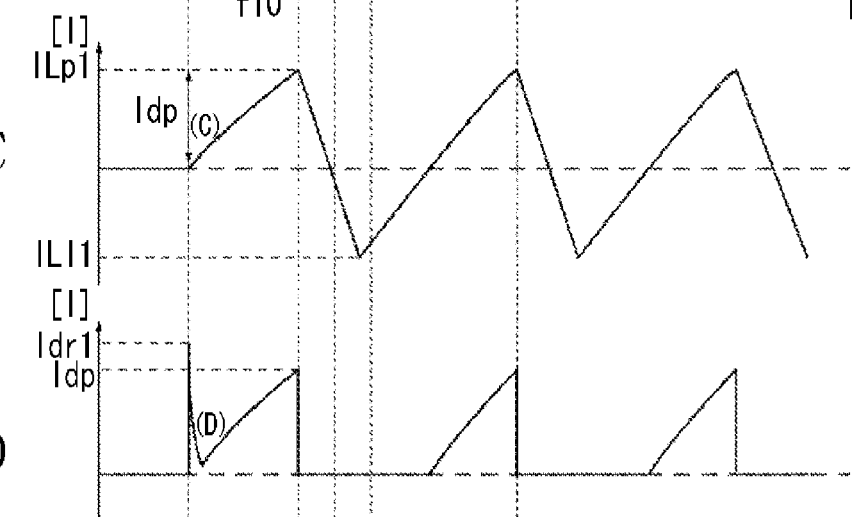
FIG. 7C
FIG. 7D
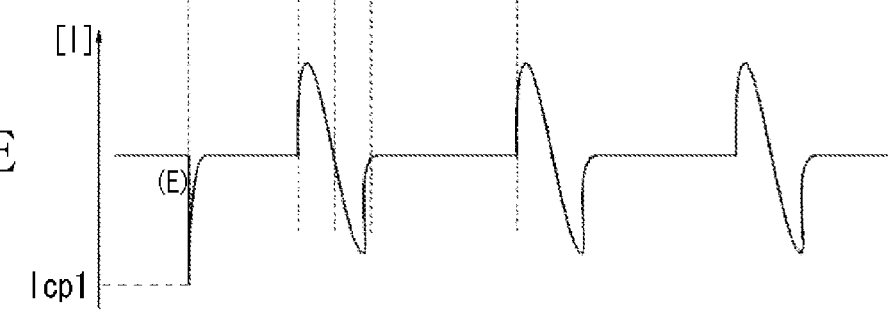
FIG. 7E

POWER SUPPLY APPARATUS AND IMAGE FORMING APPARATUS

BACKGROUND OF THE INVENTION

1. Field of the Invention

The present invention relates to a power supply that outputs a high-voltage using a piezoelectric transformer.

2. Description of the Related Art

In an image forming apparatus using an electrophotographic process, an image formed on a photosensitive member (image bearing member) is transferred on a recording material thereby forming the image on the recording material. In order to transfer the image onto the recording material, the image formed on the photosensitive member is transferred to the recording material by applying a direct current (DC) high-voltage on a transfer roller (transfer member). In order to satisfactorily transfer the image formed on the photosensitive member to the recording material, it is necessary to apply a high-voltage of a several kV or over.

As a power supply apparatus for such a high-voltage output, conventionally a wire-wound electromagnetic transformer has been used. However, the electromagnetic transformer is made up of a copper wire, a bobbin, and a core. When the electromagnetic transformer is used for the image forming apparatus using the electrophotographic process, the leakage current, which leaks from the electromagnetic transformer when a high-voltage is output, must be minimized. For this purpose, insulating the electromagnetic transformer by a mold or the like is absolutely necessary, and accordingly reduction in size and reduction in weight of the power supply apparatus could not be easily realized.

In order to realize such reduction in size and reduction in weight of the power supply apparatus, a power supply apparatus that generates a high-voltage using the piezoelectric transformer is discussed in Japanese Patent Application Laid-Open No. 11-206113.

By using a thin and lightweight piezoelectric transformer including ceramics as raw material, it becomes possible to generate a high-voltage with a higher efficiency than that of the electromagnetic transformer. Further, by using the piezoelectric transformer, it becomes possible to keep a distance between electrodes on primary side and secondary side of the power supply apparatus. As a result, the need for performing a mold processing for insulation, which is necessary in the electromagnetic transformer, can be eliminated. Therefore, with the use of the piezoelectric transformer, the reduction in size and the weight of the power supply apparatus can be realized.

Application of the power supply apparatus, which outputs a high-voltage using the piezoelectric transformer to other than such an image forming apparatus as described above, to various apparatuses that require a high-voltage has been studied.

A configuration for improving workability for attaching the piezoelectric transformer to a substrate, and for reducing a manufacturing cost, when manufacturing the power supply apparatus using such a piezoelectric transformer, is discussed in Japanese Patent Application Laid-Open No. 2006-108332. In Japanese Patent Application Laid-Open No. 2006-108332, the piezoelectric transformer is housed in an upright position within a rectangular box-shaped case, and a terminal of the case and the piezoelectric transformer are connected by a lead wire and soldered, in order to connect electrodes of the piezoelectric transformer and patterns on the printed circuit board.

Further, through the similar configuration to that of Japanese Patent Application Laid-Open No. 2006-108332, a configuration, in which reduction in assembly man-hours, reduction in cost of materials have been realized, is discussed in Japanese Patent Application Laid-Open No. 10-74992. In Japanese Patent Application Laid-Open No. 10-74992, in order to house the piezoelectric transformer in an upright position within a rectangular box-shaped case, and connect electrodes of the piezoelectric transformer and patterns on the printed circuit board, a terminal of the case is connected to the piezoelectric transformer via a conductive rubber, to bring them into conduction. With this configuration, number of assemblyman-hours can be reduced, and reduction in cost becomes possible.

In a configuration using a conductive elastic member (rubber) like the one discussed in Japanese Patent Application Laid-Open No. 10-74992, an allowable current of the conductive rubber is several hundreds milliampere (mA), namely, the allowable current thereof is significantly lower than the allowable current of a lead wire having the order of a few amperes (A), for instance. For this reason, when a DC high-voltage is output as described above, an electric charge is charged from the terminal of a power supply to a capacitance on a primary side of the piezoelectric transformer, and then the electric charge is instantaneously pulled out. As a result, a surge current is generated. The surge current may become a factor responsible for deteriorating the above-described conductive rubber. Therefore, the conductive rubber will be eventually deteriorated by the surge current each time the power supply outputs a high-voltage.

Consequently, for example, like the above-described image forming apparatus, when the piezoelectric transformer is used for an apparatus that needs to output a high-voltage frequently and for long period of time for an image forming, the conductive rubber will be eventually deteriorated. Consequently, it becomes difficult to endure a long-term use. Further, the surge current not only deteriorates the conductive rubber, but also becomes a factor responsible for eventually degrading a peak value of a drive voltage for driving the piezoelectric transformer.

SUMMARY OF THE INVENTION

The present invention is directed to a power supply apparatus that enables to connect a substrate and a piezoelectric transformer using a conductive rubber, to protect the conductive rubber from a surge current, and to reduce an influence of the surge current on a drive voltage of the piezoelectric transformer, and to an image forming apparatus that includes the power supply apparatus.

According to an aspect of the present invention, a power supply apparatus includes a piezoelectric transformer, a holding unit that holds the piezoelectric transformer, a conductive rubber member that connects the holding unit to the piezoelectric transformer, a drive unit configured to supply a drive signal to the piezoelectric transformer, an output unit configured to output a high-voltage from the piezoelectric transformer according to the drive signal from the drive unit, and a current reduction unit configured to reduce a surge current generated when the drive unit is driven.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 2A to 2F are voltage and current waveform diagrams when a circuit of a high-voltage power supply using a piezoelectric transformer according to the present invention is driven.

FIGS. 7A to 7E are voltage and current waveform diagrams when a high-voltage power supply circuit using a piezoelectric transformer, which is a prerequisite to the present invention, is driven.

DESCRIPTION OF THE EMBODIMENTS

Various exemplary embodiments, features, and aspects of the invention will be described in detail below with reference to the drawings.

Hereinbelow, a configuration, and an operation of a power supply apparatus that outputs a high-voltage using a piezoelectric transformer, which is a prerequisite to the present invention, will be described. After describing the prerequisite configuration and operation, exemplary embodiments will be described. It is to be noted that exemplary embodiments illustrated below are just examples, and it is not intended to limit a technical scope of the invention only to these exemplary embodiments.

Figure 6:
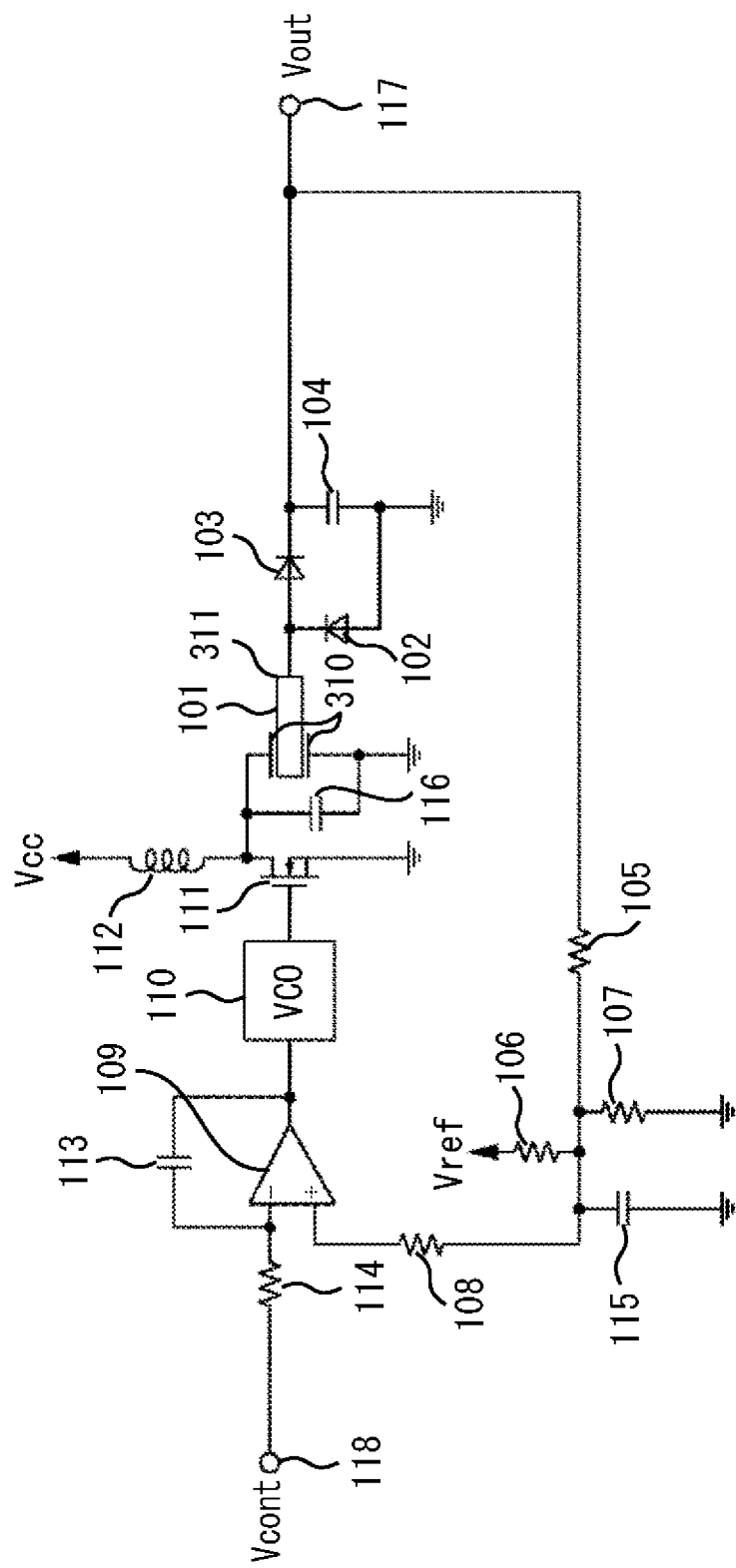
FIG. 6 is a circuit diagram of a high-voltage power supply using a piezoelectric transformer, which is a prerequisite to the present invention.

FIG. 6 illustrates a prerequisite configuration of a power supply apparatus that outputs a high-voltage using a piezoelectric transformer. The prerequisite configuration is a configuration before countermeasures are taken against the above-described surge current.

In FIG. 6, a high-voltage output control signal (hereinafter, referred to as Vcont), which is an analog signal output from a controller (not illustrated) to a terminal 118, is input to an inverting-input terminal (negative terminal) of an operational amplifier 109 via a resistor 114. The resistor 114, the operational amplifier 109, and a capacitor 113 work as an output voltage-control circuit (integrating circuit).

A Voltage obtained by dividing an output voltage (hereinafter, referred to as Vout) by resistors 105, 106, and 107 is input via a capacitor 115 and a protection resistor 108 to a non-inverting input terminal (positive terminal) of the operational amplifier 109. The operational amplifier 109 outputs a voltage from an output terminal thereof so that a voltage value of the Vcont input to an inverting input terminal (negative terminal) equals the voltage obtained by dividing the Vout by the resistors 105, 106, and 107.

The output terminal of the operational amplifier 109 is connected to a voltage-controlled oscillator (VCO) 110 (hereinafter, referred to as VCO 110). The VCO 110 is an oscillator, which works as a drive signal input unit that outputs a frequency signal for driving a switching element 111 depending on a voltage to be input.

The VCO 110 causes a switching element 111 to perform switching at a frequency determined according to an output voltage of the operational amplifier 109 to supply voltage to a primary side of the piezoelectric transformer 101. In the primary side of the piezoelectric transformer 101, two electrodes 310 for inputting the drive signal, and one electrode 311 for outputting a high-voltage are provided.

Now, FIGS. 7A to 7E illustrate waveforms of voltage signals and current signals, when the piezoelectric transformer 101 is driven. In the present exemplary embodiment, a field effect transistor (FET) is used as the switching element 111 of FIG. 6. Hereinafter, the switching element 111 is described as the FET 111.

For each signal in FIGS. 7A to 7E, a signal waveform input from the VCO 110 to the FET 111 is illustrated as (A). The signal waveform (A) in ON state (gate voltage is in high state) within one cycle of an input signal to the FET 111 is illustrated as Ton. A voltage value of the input signal is Vgs, which is lower than Vcc.

The voltage signals and current signals synchronized with the timings of t0, t1, t2, and t3 of signals input to the FET 111 are as follows. (D) illustrates a drain current Id of the FET 111, (C) illustrates a current IL, which flows through an inductor 112, (B) illustrates a drain-source voltage Vds. Furthermore, (E) illustrates a current Ic, which flows through a combined total capacitance of a resonant capacitor 116 and the primary side capacitance of the piezoelectric transformer 101.

While the FET 111 is in ON state during the Ton period (period from t0 to t1), a current IL equals a current Id. This indicates that all currents of the inductor 112 flow into the FET 111. When the FET 111 is turned off, the current Id becomes instantaneously zero. The inductor current IL, which has been flowing through the FET 111 until that time, flows into the capacitances of the resonant capacitor 116 and the primary side of the piezoelectric transformer 101. As a result, the capacitances are charged.

Then, the drain-source voltage Vds of the FET 111 starts rising. Immediately after the FET 111 is turned off, a voltage value of the Vds rapidly increases. Such a voltage rise of the Vds is caused by an inductor-capacitor (LC) resonance phenomenon of the capacitances of the inductor 112 and the resonant capacitor 116 and the primary side of the piezoelectric transformer 101. Then, a frequency f10 at this time is expressed by the following equation (1).

$$f10 \cong 1/2\pi\sqrt{LC} \qquad (1)$$

Further, while the FET 111 is in ON state during a period (period from t0 to t1), a drain current Idp is expressed by the following equation.

$$I_{dP} \cong \frac{V}{L} \cdot \text{Ton} \quad (2)$$

Energy E accumulated in the inductor 112 by the drain current Idp, assuming losses due to resistance component and wiring resistance and the like of the inductor 112 to be zero, is equivalent to energy E accumulated in the capacitances of the resonant capacitor 116 and the primary side of the piezoelectric transformer 101, by a voltage amplitude value Vdsp of the Vds. Therefore, the following equation (3) is obtained.

$$E \cong \frac{1}{2} L I_{dP}^2 \cong \frac{1}{2} C V_{dsP}^2 \quad (3)$$

If the equation is solved with respect to the voltage amplitude value Vdsp, the following equation is obtained.

$$V_{dsP} \cong \sqrt{L/C} \cdot I_{dP} \quad (4)$$

Electric charge is charged to the capacitances of the resonant capacitor 116 and the primary side of the piezoelectric transformer 101 from t1 to t2, by the drain-source voltage Vdsp, and electric charge accumulated in the capacitances of the resonant capacitor 116 and the primary side of the piezoelectric transformer 101 between t2 and t3 are discharged. At this time, electric charge, which has been charged, and electric charge, which is discharged, are equivalent.

A flyback voltage is generated by the LC voltage resonance as an input voltage, which is supplied to the primary side of the piezoelectric transformer. The piezoelectric transformer 101 oscillates in response to a driving frequency of an input voltage signal supplied to the primary side, and generates an AC voltage by amplifying the input voltage with a boosting ratio determined according to a size of the piezoelectric transformer 101 to the secondary side. The generated AC voltage is rectified and smoothened by diodes 102, 103 and a capacitor 104 to a positive voltage, and subsequently supplied from the terminal 117 to a load.

The load to which the voltage is supplied includes a transfer roller serving as a transfer member of the above-described image forming apparatus. As a target to which the voltage is supplied, a development unit, a charging unit and other members in the image forming apparatus may be included.

Figure 11:
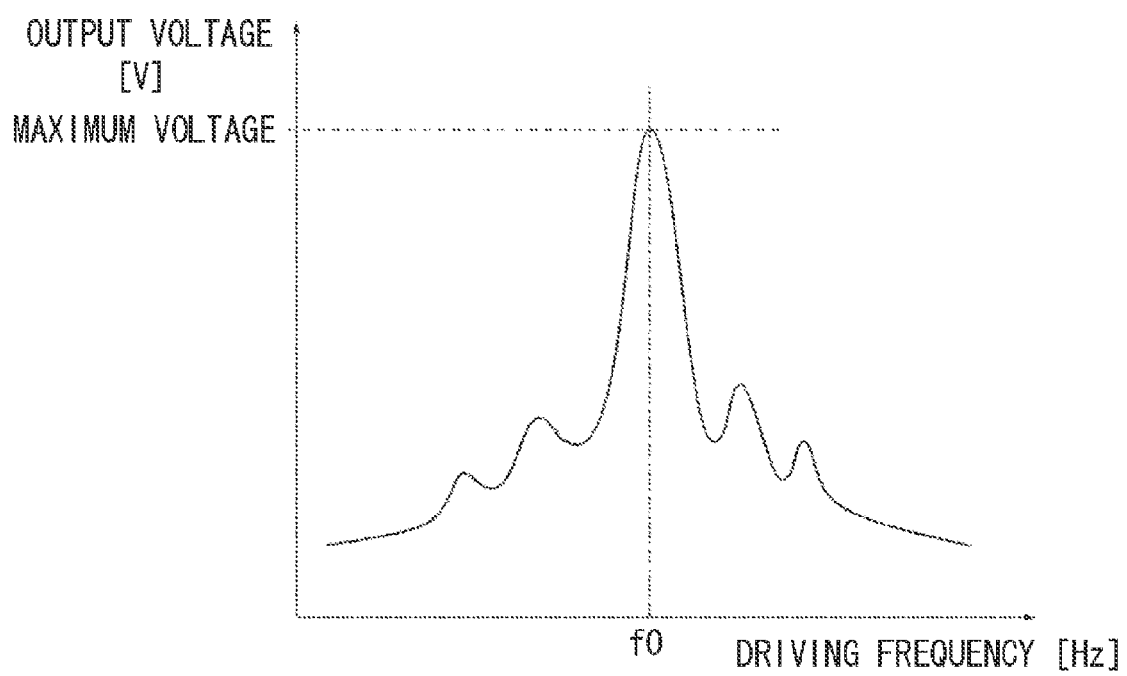
FIG. 11 is a graph illustrating a characteristic of frequency and output voltage that drives a piezoelectric transformer.

Here, a frequency characteristics and an output voltage characteristics of the piezoelectric transformer 101 shows a spreading-toward-the-bottom characteristic in such a way that an output voltage becomes a maximum voltage at the resonance frequency f0 as illustrated in FIG. 11. The characteristic indicates that the output voltage can be controlled by performing the variable control of the frequency.

When the output voltage is controlled at a higher driving frequency than the resonance frequency f0 at which a maximum voltage is output, in order to increase the output voltage of the piezoelectric transformer, the driving frequency may be changed from higher to lower frequency. To the contrary, when the output voltage is controlled at a lower driving frequency than the resonance frequency f0, the driving frequency may be changed from lower to higher frequency.

Next, in the power supply apparatus using such a piezoelectric transformer, generation of the surge current and the deterioration of the conductive rubber due to the surge current will be described. The power supply apparatus has a configuration for connecting the terminal of the case serving as a holding member and the piezoelectric transformer using the above-described conductive elastic member (conductive rubber).

Figure 12:
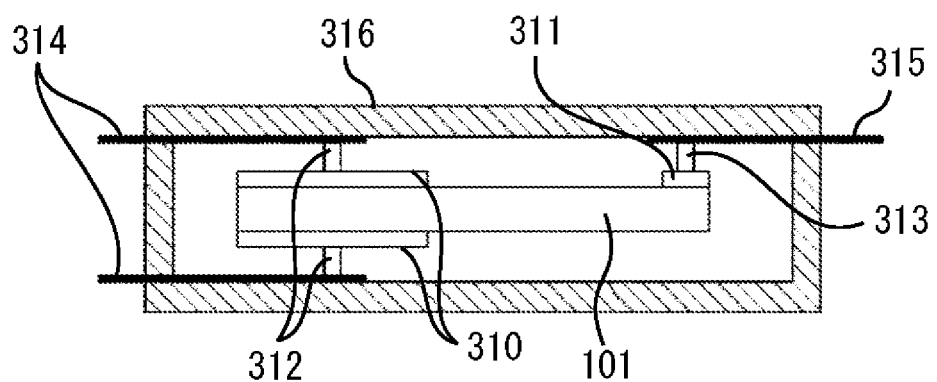
FIG. 12 illustrates an example configuration when an electrode of a piezoelectric transformer and an electrode of a case are connected using a conductive rubber.

FIG. 12 illustrates a schematic configuration of the piezoelectric transformer using the conductive rubber. In FIG. 12, in the piezoelectric transformer 101 (piezoelectric element 101), electrodes 310 are provided on the primary side to which a drive signal is input, and electrode 311 is provided on the secondary side from which voltage is output. The piezoelectric transformer 101 (piezoelectric element 101) is held within a case 316 serving as a holding member. The electrodes 310 and electrode 314 of the case 316 are connected by conductive rubbers 312, and the electrode 311 and an electrode 315 of the case 316 are connected by a conductive rubber 313.

In such a configuration, the surge current generated when the piezoelectric transformer is driven becomes a factor responsible for the deterioration of the conductive rubber. In the configuration of the present exemplary embodiment, as a conductive rubber (elastic member), a silicon rubber is used as a base material and silver is mixed thereinto as a conductive material. Other than silver as the conductive material, carbon may be mixed thereinto. The material having elasticity and conductivity can be used as a conductive rubber.

Hereinbelow, generation of the surge current and deterioration of the conductive rubber will be described. When the power supply apparatus is turned on, an electric charge is charged via the terminal of the power supply to the capacitance on the primary side of the piezoelectric transformer, and the drive signal is input to the FET, which drives the piezoelectric transformer. When the FET is turned on, the electric charge, which has been charged to the capacitance of the primary side of the piezoelectric transformer, is instantaneously pulled away. As a result, the surge current is generated. Since the surge current, which is about a few amperes (A), is greater than the allowable current of the conductive rubber (several hundreds milliamperes), the conductive rubber will be deteriorated each time the FET is turned on.

Figure 8:
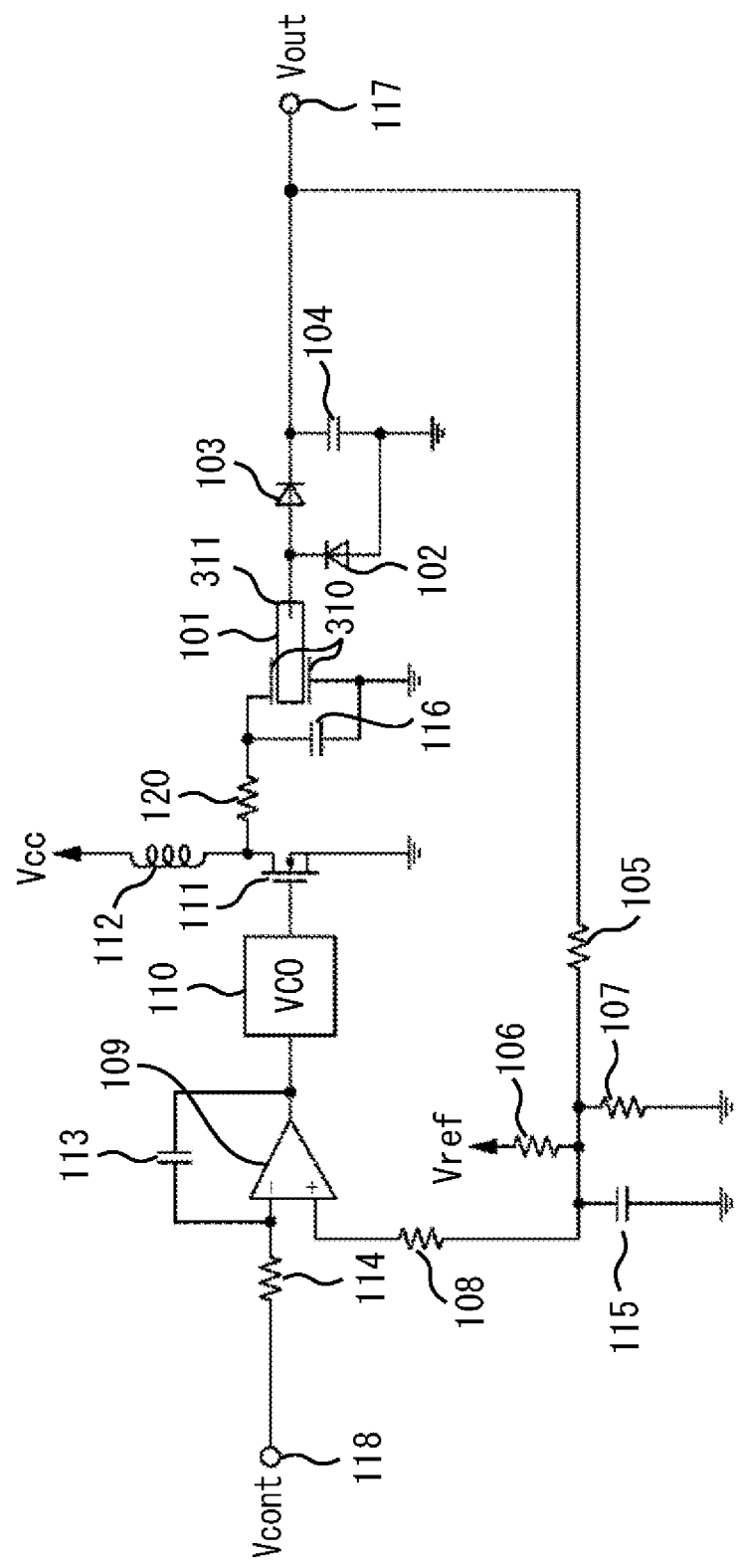
FIG. 8 is a circuit diagram of a high-voltage power supply using a piezoelectric transformer, which is a prerequisite to the present invention.

Next, an influence of the surge current upon the drive voltage of the piezoelectric transformer will be described. FIG. 8 illustrates a configuration in which a connection point between the inductor 112 and the FET 111 is connected to the resonant capacitor 116 via the resistor 120, on the precondition of the above-described FIG. 6. FIGS. 9A to 9E illustrate drive signal waveforms of the piezoelectric transformer in the power supply apparatus illustrated in FIG. 8, respectively.

A first clock (also simply denoted as 1clk) of the drive signal for driving the piezoelectric transformer 101 is input to the FET 111. When the FET 111 is turned on, an electric charge, which has been charged to the capacitance on the primary side of the piezoelectric transformer 101, is instantaneously pulled away. As a result, the surge current is generated. The surge current is reduced since the resistor 120 works as a current limiting resistor.

Figure 9A:
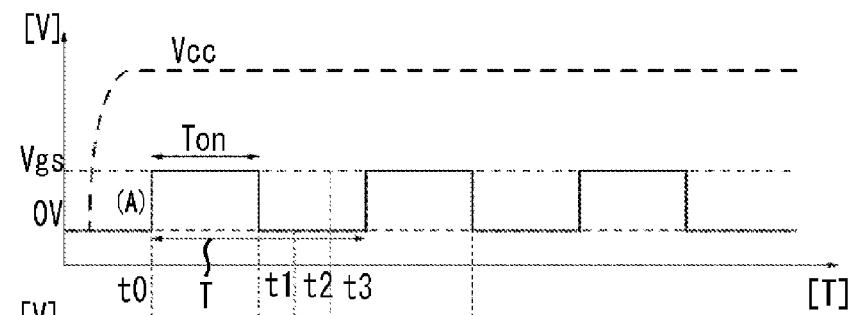
FIGS. 9A to 9E are voltage and current waveform diagrams when a high-voltage power supply circuit using a piezoelectric transformer, which is a prerequisite to the present invention, is drive.
Figure 9B:
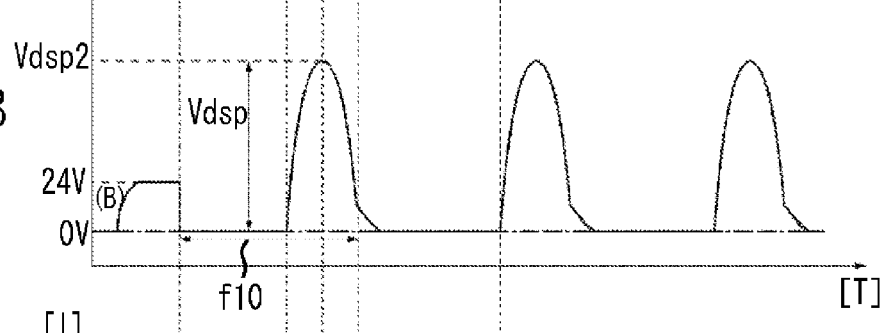
Figure 9C:
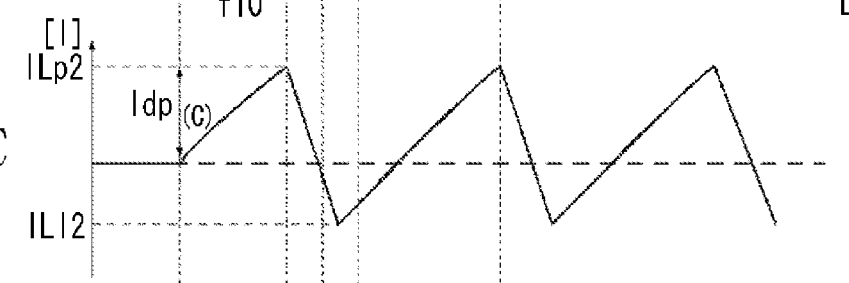
Figure 9D:
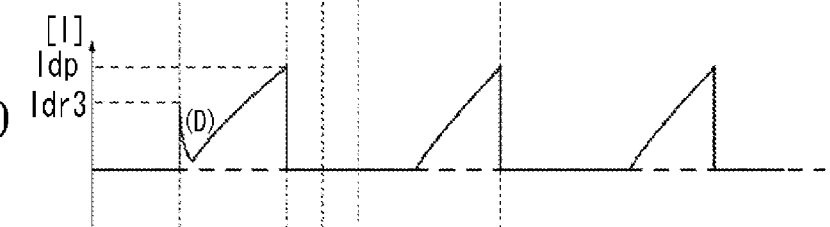
Figure 9E:
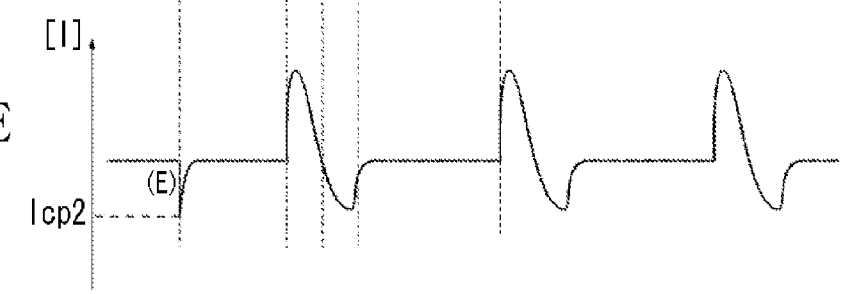

As illustrated in FIG. 7E and FIG. 9E, an electric charge, which has been charged to the capacitance of the primary side of the piezoelectric transformer 101, is instantaneously pulled away, and it can be seen that generated surge current indicated by Icp1 and Icp2 satisfy Icp1>Icp2, thus it is reduced.

Therefore, the surge currents, each of which flows through the drain of the FET 111 satisfy Idr1>Idr2. However, when the FET 111 is turned off, energy accumulated in the inductor 112 is lost by the resistor 120. Accordingly, a current IL12, which flows through the inductor 112, satisfies IL11>IL12, compared with IL11 of FIG. 7C, and a mean current of IL will be lowered. Therefore, a peak voltage of the drive voltage Vds of the piezoelectric transformer 101 will be eventually lowered down to Vdsp2 (<Vdsp1).

A configuration for suppressing the deterioration of the conductive rubber caused by such a generation of the surge current, and the degradation of a voltage amplitude value of the drive voltage will be described below based on the exemplary embodiments.

Hereinbelow, a first exemplary embodiment will be described. However, a configuration described in the present exemplary embodiment is just an example, and it is not intended to limit only to the configuration described below.

Next, a circuit configuration of a power supply, which outputs a high-voltage using the piezoelectric transformer (hereinafter described as a high-voltage power supply or a high-voltage power supply apparatus), and voltage and current waveforms when driven according to the first exemplary embodiment will be described with reference to FIG. 1 and FIG. 2.

Figure 1:
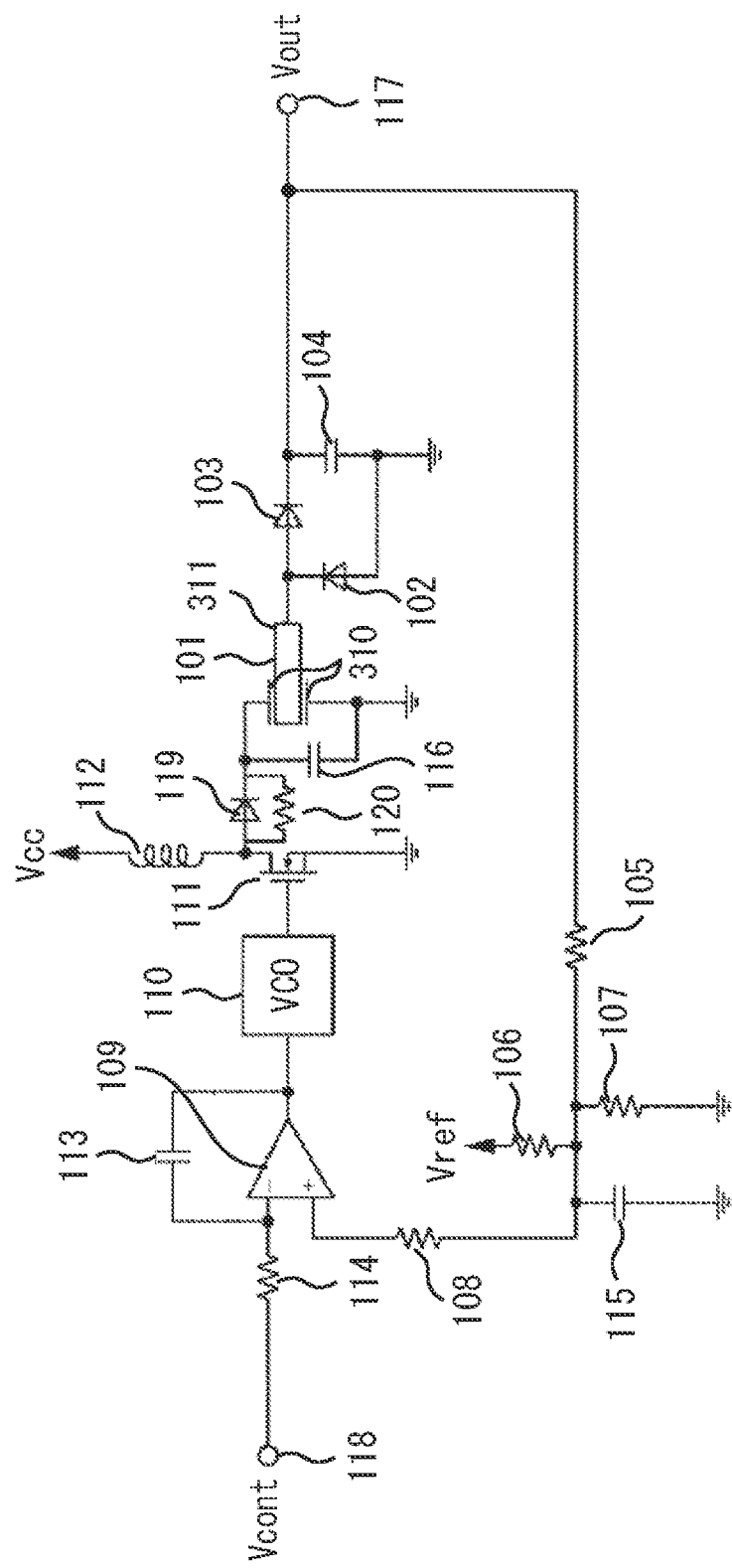
FIG. 1 is a circuit diagram of a high-voltage power supply according to a first exemplary embodiment.

FIG. 1 is a circuit according to the first exemplary embodiment, which includes the inductor 112 connected to a positive electrode terminal (Vcc) of a DC power supply, and a switching element (hereinafter referred to as FET) 111 connected in series between the inductor 112 and a negative electrode terminal (GND) of the DC power supply. Then, a connection point between the inductor 112 and the FET 111 is connected to the piezoelectric transformer 101 via the resistor 120, and the other terminal of the piezoelectric transformer 101 is connected to the negative electrode terminal (GND) of the DC power supply.

Furthermore, the resonant capacitor 116 is connected in parallel to the piezoelectric transformer 101. A connection point where the inductor 112 and the FET 111 are connected in series, is connected to an anode of a diode 119, and a cathode is connected to the piezoelectric transformer 101.

A circuit according to the present exemplary embodiment is featured that it includes diode 119 and the resistor 120 and the resonant capacitor 116, when compared with a conventional circuit configuration illustrated in FIG. 6. A circuit of the diode 119 and the resistor 120, and the resonant capacitor 116 works as a current suppression circuit for suppressing the surge current. Further, a circuit constituted by the inductor 112, the FET 111, the diode 119, the resistor 120, and the resonant capacitor 116 works as a drive circuit of the piezoelectric transformer 101.

In such a circuit configuration of the power supply apparatus, the piezoelectric transformer 101 is configured such that the terminal of the case and the piezoelectric transformer are connected using the above-described conductive rubber. Furthermore, it is configured such that, after the DC power supply is turned on, an input signal for driving the piezoelectric transformer is input to the FET 111.

FIGS. 2A to 2F illustrate the current and voltage waveforms when the circuit of the present exemplary embodiment is operated. Respective signals in FIGS. 2A to 2F are waveforms that correspond to waveforms illustrated in FIGS. 7A to 7E, and FIGS. 9A to 9E.

Similar to FIGS. 7A to 7E, and FIGS. 9A to 9E, a signal waveform input from voltage-controlled oscillator (VCO) 110 to the FET 111 is illustrated as (A). The signal waveform (A) in ON state (gate voltage is in high state) within one cycle of an input signal to the FET 111 is illustrated as a Ton. A voltage value of the input signal is Vgs, which is lower than Vcc.

As voltage signals and current signals in synchronization with the timings of t0, t1, t2, and t3 in a signal that is input to the FET 111, (D) indicates a drain current Id of the FET 111, (C) a current IL that flows through the inductor 112, (B) a drain-source voltage Vds. Furthermore, (E) indicates a current Ic, which flows through a combined capacitance of the resonant capacitor 116 and the capacitance of the primary side of the piezoelectric transformer 101. (F) indicates a current ID that flows through the diode 119, and a current IR that flows through the resistor 120, which are newly added to the circuit of the present exemplary embodiment.

While the FET 111 is in the Ton (period from t0 to t1) (i.e., in ON state), IL and Id substantially match with each other. This indicates that all currents of the inductor 112 flow into the FET 111. When the FET 111 is turned off, the Id becomes instantaneously zero (at the timing of t1).

The inductor current IL, which has been flowing to the FET 111 until that time, flows into the capacitances of the resonant capacitor 116 and the capacitance of the primary side of the piezoelectric transformer 101, to charge thereof. Then, a drain-source voltage Vds of the FET 111 starts rising. Immediately after the FET 111 is turned off, the drain-source voltage Vds jumps high (period from t1 to t2). The frequency f10 of the drain-source voltage waveform Vds is given by the above-described equation (1).

Further, while the FET 111 is in the Ton (period from t0 to t1) (i.e., in ON state), a drain current Idp is given by the above-described equation (2). Further, a voltage value when the drain-source voltage Vds jumps high (period from t1 to t2) is given by the above-described equation (3).

Energy E accumulated in the inductor 112 by the drain current Idp is lost by the resistance component and the wiring resistance of the inductor 112. However, these losses are very small and negligible.

Furthermore, when the drain-source voltage Vds rises to activate the diode 119 to the capacitances of the resonant capacitor 116 and the primary side of the piezoelectric transformer 101, a loss voltage (denoted as Vf) of the diode 119 exists. However, the loss voltage satisfies a voltage amplitude value Vdsp3>>Vf, of the drain-source voltage, and a root mean square (RMS) value of the voltage of the drain-source voltage Vds for driving the piezoelectric transformer is not influenced.

Hence, energy E accumulated in the capacitances of the resonant capacitor 116 and the primary side of the piezoelectric transformer 101 by the voltage amplitude value Vdsp3 of the drain-source voltage Vds are equivalent to each other. Therefore, the above-described equation (3) holds. Then, in the period from t2 to t3, an electric charge accumulated in the capacitances of the resonant capacitor 116 and the primary side of the piezoelectric transformer 101 is discharged via the resistor 120.

Through the circuit configuration of the present exemplary embodiment, charging of electric charge is performed via the diode 119, and the piezoelectric transformer 101 can be driven without having an influence on the drive voltage Vds of the piezoelectric transformer 101 compared with conventional configuration. Furthermore, the resistor 120 works as a current limiting resistor, against the surge current generated when the first clock (1clk) of the drive signal is input to the FET 111 and the FET 111 is turned on. For this reason, the surge current becomes Icp1 (see FIG. 7E)>Icp3 and Idr1 (see FIG. 7D)>Idr3, and it can be reduced.

In other words, the circuit of the diode 119 and the resistor 120, the resonant capacitor 116 according to the present exemplary embodiment works as a current regulation circuit (or current suppression circuit) for regulating or suppressing the surge current. Thereby, the conductive rubbers of the FET 111 and the piezoelectric transformer 101 can be protected from the surge current, and thus the deterioration thereof can be reduced.

Further, compared with the configuration in which the resistor 120 illustrated in FIG. 8 is provided, the voltage amplitude value of the FET 111 satisfies Vdsp3>Vdsp2 (see FIG. 8). Therefore, the reduction of the voltage amplitude value of the FET hardly occurs.

Further, the resonant capacitor 116 is connected in parallel to the capacitance on the primary side of the piezoelectric transformer. It contributes to relatively reduce an individual dispersion of the piezoelectric transformer, and make a flyback voltage in the vicinity of the resonance frequency of the piezoelectric transformer to be a desirable value. If the individual dispersion of the piezoelectric transformer is not large, the similar effect can be obtained, even in the circuit configuration in which the resonant capacitor 116 is not provided.

Further, in the present exemplary embodiment, although the FET is used as the switching element 111, the power supply apparatus can be operated similarly even if a bipolar transistor is used.

As described above, according to the present exemplary embodiment, in the power supply apparatus with a configuration for connecting the terminal of the case and the piezoelectric transformer using the conductive rubber, the conductive rubber can be protected from the surge current generated when the switching element is turned on, and the deterioration of the conductive rubber can be reduced. Further, according to the present exemplary embodiment, the degradation of the amplitude value of the drive voltage from the switching element can be reduced.

Next, an example image forming apparatus of the electrophotographic process to which the high-voltage power supply apparatus of the present exemplary embodiment is applied will be described. As the image forming apparatus, a color laser printer will be described as an example thereof.

Figure 10:
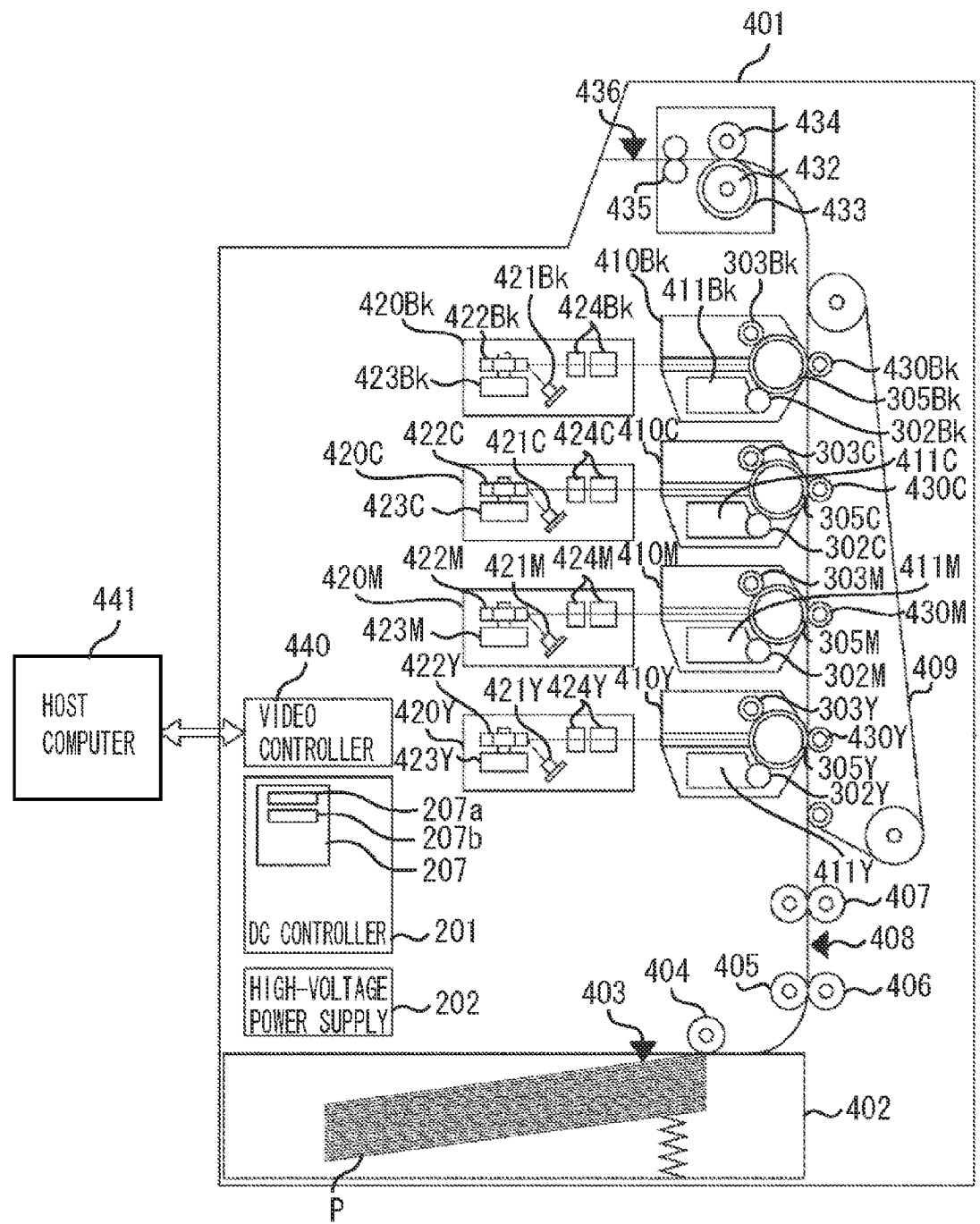
FIG. 10 illustrates an example configuration of a color laser printer in which a power supply according to the present invention is applied.

FIG. 10 illustrates a schematic sectional view of a color laser printer. In FIG. 10, the color laser printer main body 401 includes a sheet feed cassette 402 serving as a sheet feed unit for holding a recording material P, and a sheet presence sensor 403 for detecting presence/absence of a recording material P within the sheet feed cassette 402.

A sheet feed roller 404 feeds the recording material P from the sheet feed cassette 402. A conveyance roller 405 conveys the recording material P supplied by the sheet feed roller 404. A separation roller 406 prevents double feeding of the recording material P in cooperation with the conveyance roller 405. In addition, a registration roller pair 407, which conveys the recording material P in synchronization with an image, and a sensor 408, which detects a conveyance state of the recording material P to the registration roller pair 407, are arranged in the downstream of the conveyance roller 405.

Further, an electrostatic attraction conveying transfer belt (hereinafter, referred to as ETB: electrostatic transfer belt) 409 is arranged in the downstream of the registration roller pair 407. The ETB 409 electrostatically attracts and conveys the recording material P. Process cartridges 410Y, 410M, 410C, and 410BK for four colors (yellow (Y), magenta (M), cyan (C), black (Bk)) for forming images described below are mounted opposing to the ETB 409.

Furthermore, scanner units 420Y, 420M, 420C, and 420Bk, which emit laser beam onto photosensitive drums serving as image bearing members of respective cartridges are provided. The images of respective colors formed by the image forming unit including the scanner units and the process cartridges, are transferred sequentially and in a superposed manner to the recording material by transfer rollers 430Y, 430M, 430C, and 430Bk to form a color image.

After that, the color image transferred on the recording material P is conveyed to a fixing unit. The fixing unit fixes the color image on the recording material by heating and pressing. The fixing unit includes a fixing roller 433 equipped with a heater 432 for heating and a pressure roller 434. A sheet discharge roller pair 435 for conveying the recording material P from the fixing unit and a sheet discharge sensor 436, which detects a conveyance state of the recording material P from the fixing unit, are arranged in the downstream of the fixing unit.

Further, each scanner unit 420 (420Y, 420M, 420C, and 420Bk) is a unit for emitting the laser beam modulated according to an image signal sent from a video controller 440. Each scanner unit includes a laser unit 421, a polygonal mirror 422 for scanning the laser beam from the laser unit 421 on a photosensitive drum 305, a motor 423 for rotating the polygonal mirror 422, and an imaging lens group 424. Each component of each scanner unit is similarly configured, respectively.

In FIG. 10, the laser units 421, the polygonal mirrors 422, and the motors 423 are illustrated, each suffixed with Y, M, C, Bk. Then, each process cartridge 410 includes the photosensitive drum 305 (305Y, 305M, 305C, and 305Bk), and a charging roller 303 (303Y, 303M, 303C, 303Bk) for charging the photosensitive drum 305.

Further, each process cartridge 410 includes a development roller 302 (302Y, 302M, 302C, and 302Bk) for developing an electrostatic latent image formed on the photosensitive drum 305, and a toner container 411 (411Y, 411M, 411C, and 411Bk). Each process cartridge is configured to be detachably mounted to the laser printer 401 main body.

A video controller 440 receives a printing instruction and image data sent from an external device 441 such as a personal computer or the like, and rasterizes the received image data into bitmap data, to generate an image signal for forming an image.

Further, a DC controller 201 is a control unit for controlling an image forming operation of a laser printer 401. The DC controller 201 includes a microprocessor unit (MPU) (microcomputer) 207, various control circuits (not illustrated), and the like. The MPU 207 includes a random-access memory (RAM) 207a, a read-only memory (ROM) 207b, and the like. The DC controller controls the feeding of the above-described recording material and the image forming operation.

A high-voltage power supply 202 for outputting a high-voltage uses the above-described piezoelectric transformer. The high-voltage power supply includes a charging high-voltage power supply (not illustrated) and a development high-voltage power supply (not illustrated) corresponding to each process cartridge 410, and a transfer high-voltage power supply corresponding to each transfer roller 430, respectively.

The configuration of the image forming apparatus has been described, taking a color image forming apparatus of a system for performing multiple transfer of developer (also referred to as tandem system) using a plurality of photosensitive drums (four photosensitive drums) as an example. However, as the image forming apparatus using a high-voltage (also referred to as high-voltage bias), the present exemplary embodiment can be applied to an apparatus including one photosensitive drum and a plurality of development devices, an apparatus using an intermediate transfer member, or a monochrome image forming apparatus.

Next, a second exemplary embodiment will be described with reference to FIG. 3. However, description of components similar to those illustrated in the above-described first exemplary embodiment will be omitted.

Figure 3:
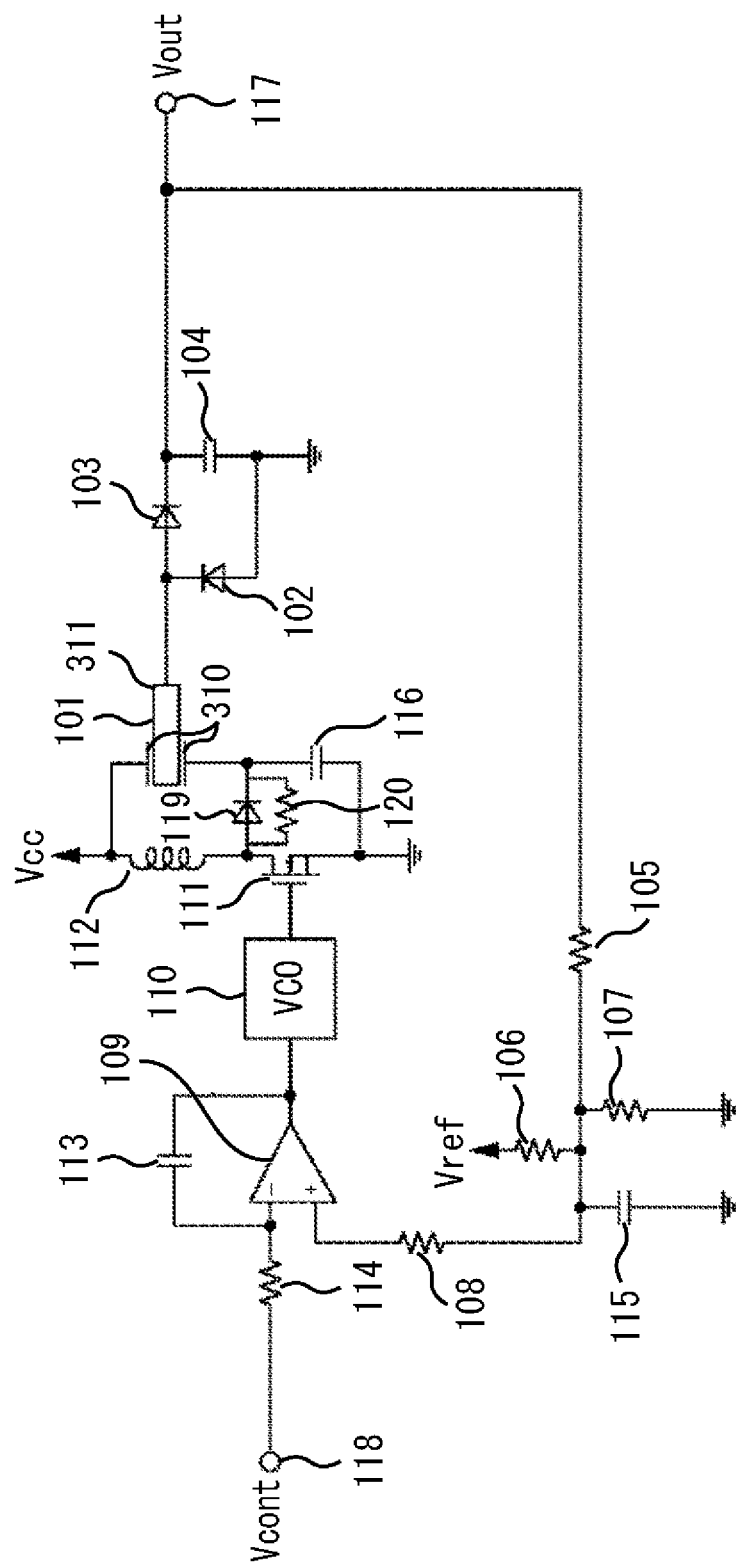
FIG. 3 is a circuit diagram according to a second exemplary embodiment of the present invention.

A circuit configuration of the second exemplary embodiment is illustrated in FIG. 3. More specifically, the inductor 112 is connected to a positive electrode terminal (Vcc) of the DC power supply, and the switching element 111 is connected in series between the inductor 112 and a negative electrode terminal (GND) of the DC power supply. A connection point between the inductor 112 and the switching element 111 is connected to the piezoelectric transformer 101 via the resistor 120. In addition, the other terminal of the piezoelectric transformer is connected to the positive electrode terminal of the DC power supply.

Furthermore, a connection point between the resistor 120 and the piezoelectric transformer 101 is connected to the resonant capacitor 116, and the other terminal of the resonant capacitor 116 is connected to the negative electrode terminal of the DC power supply. Furthermore, a connection point where the inductor 112 and the switching element 111 are connected in series is connected to an anode of the diode 119, and a cathode is connected to the piezoelectric transformer 101.

In the second exemplary embodiment, the FET is used as the switching element 111. Hereinafter, the switching element 111 is described as the FET 111.

With such a circuit configuration of the high-voltage power supply apparatus, similar to the first exemplary embodiment, the surge current can be reduced. In other word, when the FET 111 for the piezoelectric transformer drive is turned on, the resistor 120 works as the current limiting resistor against generated surge current, and thus the surge current is reduced.

Further, the diode 119 operates so as not to give an influence on the drain-source voltage Vds of the FET, which is a drive voltage of the piezoelectric transformer 101, and the piezoelectric transformer 101 can be driven without degrading a boosting capability.

The circuit configuration described in the second exemplary embodiment is an example of variation of the circuit configuration of the first exemplary embodiment, and since the circuit operation is similar to that illustrated in the first exemplary embodiment (operation illustrated in FIG. 2), descriptions thereof will be omitted.

Further, in the present exemplary embodiment, although the FET is used for the switching element 111, the switching element 111 can be similarly operated even if a bipolar transistor is used. Further, similar to the first exemplary embodiment, the resonant capacitor 116, which is connected in parallel to the capacitance on the primary side of the piezoelectric transformer 101, works for relatively reducing an individual dispersion of the piezoelectric transformer, and making a flyback voltage in the vicinity of the resonance frequency of the piezoelectric transformer to be a desired value. If the individual dispersion of the piezoelectric transformer is not large, a circuit configuration in which the resonant capacitor 116 is not provided may be acceptable.

As described above, according to the second exemplary embodiment, in the power supply apparatus of a configuration for connecting the terminal of the case and the piezoelectric transformer using the conductive rubber, it becomes possible to protect the conductive rubber from the surge current generated when the switching element is turned on, to reduce deterioration of the conductive rubber. Further, according to the present exemplary embodiment, degradation of amplitude value of the drive voltage output from the switching element can be reduced.

Next, a third exemplary embodiment will be described with reference to FIG. 4. However, description of components similar to those illustrated in the above-described first exemplary embodiment will be omitted.

Figure 4:
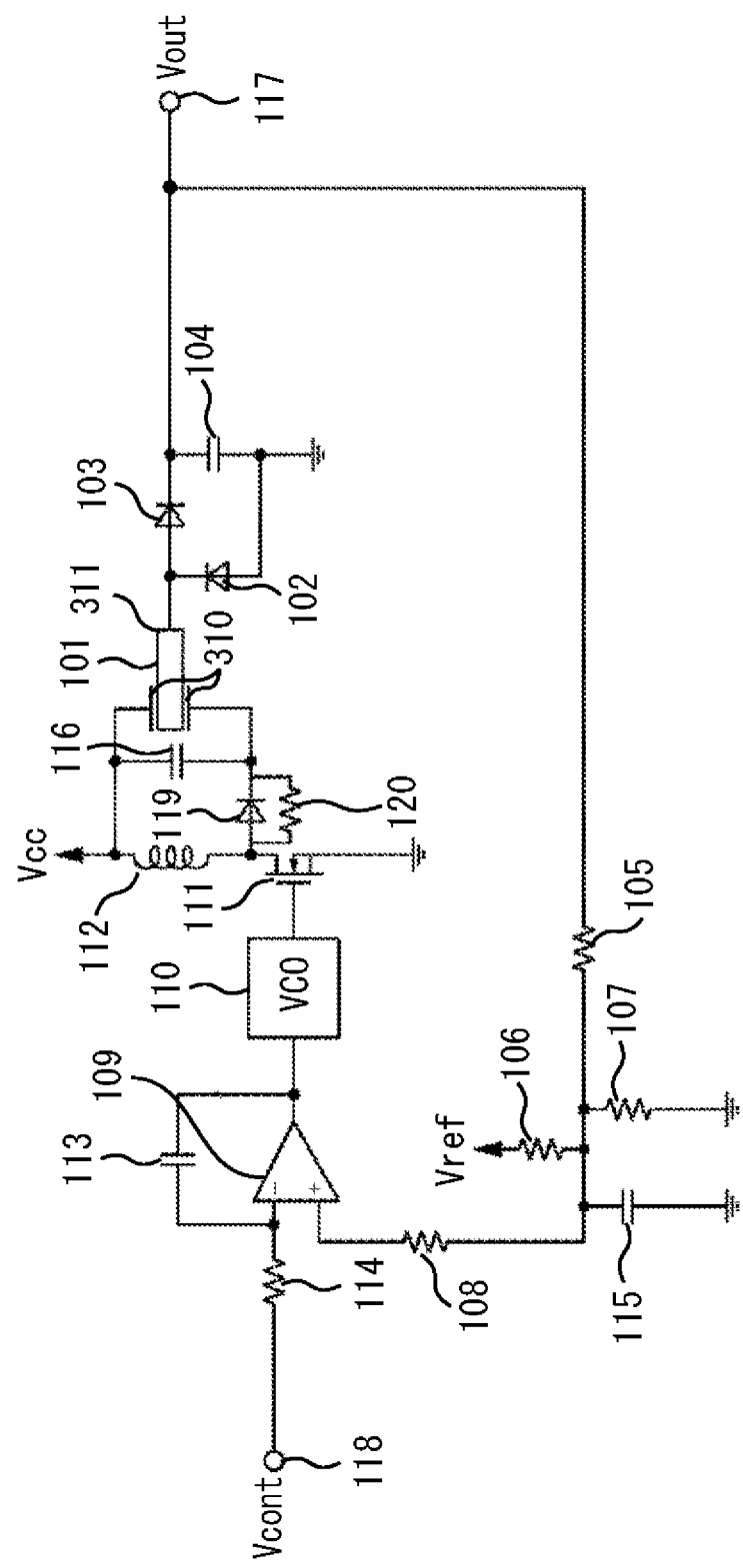
FIG. 4 is a circuit diagram of a high-voltage power supply using a piezoelectric transformer according to a third exemplary embodiment of the present invention.

A circuit configuration of the third exemplary embodiment is illustrated in FIG. 4. More specifically, the inductor 112 is connected to the positive electrode terminal (Vcc) of the DC power supply, and the switching element 111 is connected in series between the inductor 112 and the negative electrode terminal (GND) of the DC power supply. A connection point between the inductor 112 and the switching element 111 is connected to the piezoelectric transformer 101 via the resistor 120. Then, the other terminal of the piezoelectric transformer 101 is connected to the positive electrode terminal of the DC power supply.

Furthermore, the resonant capacitor 116 connected in parallel to the piezoelectric transformer 101 is connected to the positive electrode terminal of the DC power supply. A connection point where to connect the inductor 112 and the switching element 111 in series, is connected to an anode of the diode 119, and a cathode is connected to the piezoelectric transformer 101. In the third exemplary embodiment, the FET is used as the switching element 111. Hereinafter, the switching element 111 is described as the FET 111.

With such a circuit configuration of a high-voltage power supply apparatus, the surge current can be reduced, similar to the first exemplary embodiment. In other words, the resistor 120 works as the current limiting resistor against the surge current generated when the FET 111 is turned on, thereby reducing the surge current.

Further, since the diode 119 is operated so that an influence is not given on a drain-source voltage Vds of the FET 111 serving as the drive voltage of the piezoelectric transformer 101, the piezoelectric transformer 101 can be driven without degrading a boosting capability.

Further, similar to the first exemplary embodiment, the resonant capacitor 116 is connected in parallel to the capacitance on the primary side of the piezoelectric transformer 101, and works for relatively reducing an individual dispersion of the piezoelectric transformer, and making a flyback voltage in the vicinity of a resonance frequency of the piezoelectric transformer to be a desired value. If the individual dispersion of the piezoelectric transformer is not large, a circuit configuration in which the resonant capacitor 116 is not provided may be acceptable.

Further, in the third exemplary embodiment, although the FET is used for the switching element 111, the switching element 111 can be similarly (operation illustrated in FIG. 2) operated even if a bipolar transistor rather than the FET is used.

As described above, according to the present exemplary embodiment, in the power supply apparatus of a configuration for connecting the terminal of the case and the piezoelectric transformer using the conductive rubber, it becomes possible to protect the conductive rubber from the surge current generated when the switching element is turned on, to reduce deterioration of the conductive rubber. According to the present exemplary embodiment, the degradation of the amplitude value of the drive voltage from the switching element can be reduced.

Next, a fourth exemplary embodiment will be described with reference to FIG. 5. However, description of components similar to those illustrated in the above-described first exemplary embodiment will be omitted.

Figure 5:
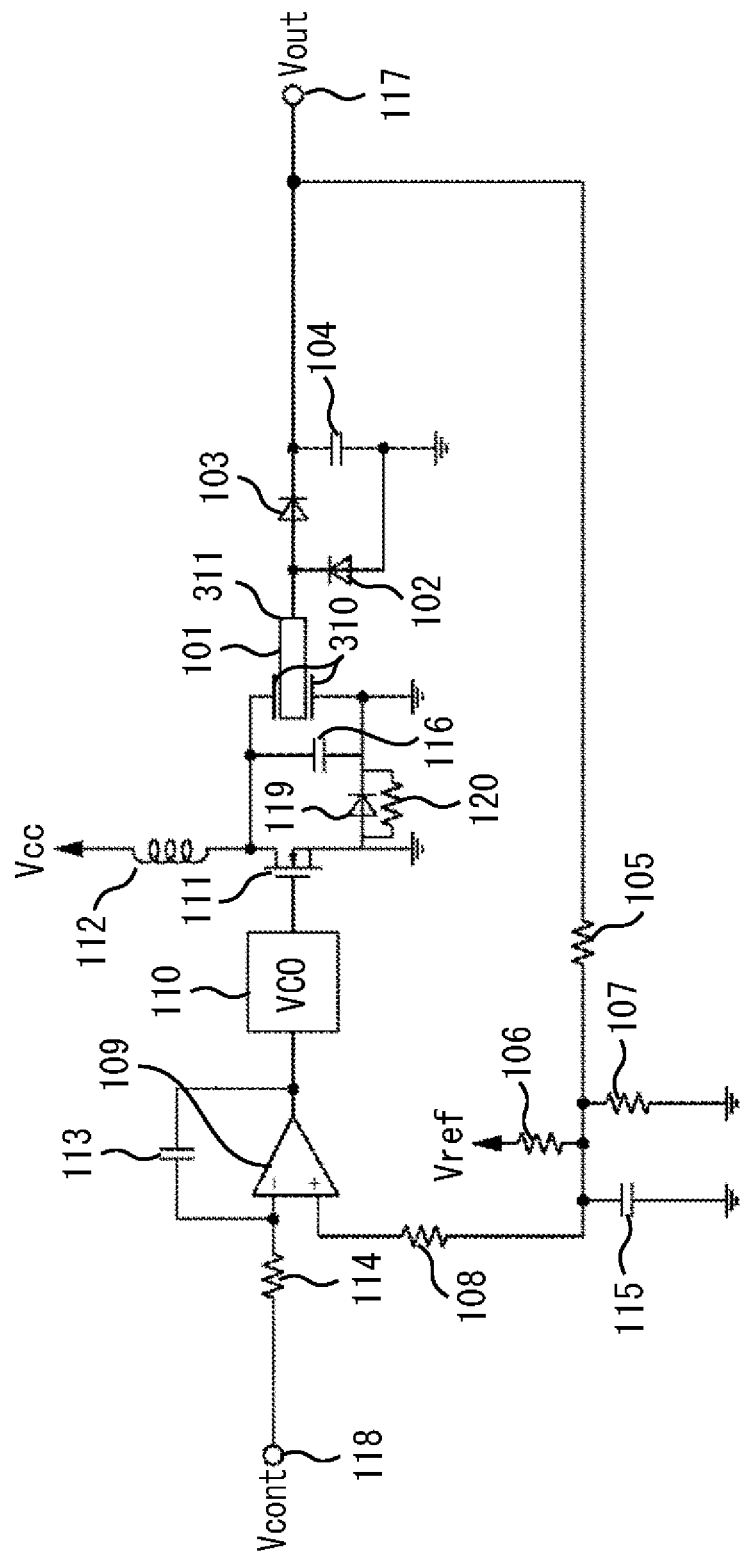
FIG. 5 is a circuit diagram of a high-voltage power supply using a piezoelectric transformer according to a fourth exemplary embodiment of the present invention.

A circuit configuration of the fourth exemplary embodiment is illustrated in FIG. 5. More specifically, the inductor 112 is connected to the positive electrode terminal of the DC power supply, and the switching element 111 is connected in series between the inductor 112 and the negative electrode terminal of the DC power supply. A connection point between the switching element 111 and the negative electrode terminal of the DC power supply is connected to the piezoelectric transformer 101 via the resistor 120.

Furthermore, the other terminal of the piezoelectric transformer 101 is connected to a connection point between the inductor 112 and the switching element 111, and the resonant capacitor 116 is connected in parallel to the piezoelectric transformer 101. Furthermore, a cathode of a rectifying element is connected to a connection point between the switching element 111 and the DC power supply, and an anode is connected to the piezoelectric transformer 101.

With such a circuit configuration of a high-voltage power supply apparatus, similar to the first exemplary embodiment, the resistor 120 works as the current limiting resistor against the surge current generated when the FET 111 is turned on, thereby reducing the surge current. Further, the diode 119 operates so that influence is not given on a drain-source voltage Vds of the FET 111 serving as the drive voltage of the piezoelectric transformer 101. As a result, the piezoelectric transformer 101 can be driven without degrading a boosting capability.

Further, similar to the first exemplary embodiment, the resonant capacitor 116, which is connected in parallel to the capacitance on the primary side the piezoelectric transformer 101, works for relatively reducing an individual dispersion of the piezoelectric transformer, and making a flyback voltage in the vicinity of a resonance frequency of the piezoelectric transformer to be a desired value. If the individual dispersion of the piezoelectric transformer is not large, a circuit configuration in which the resonant capacitor 116 is not provided may be acceptable.

Further, in the fourth exemplary embodiment, although the FET is used for the switching element 111, the switching element 111 can be similarly operated even if a bipolar transistor is used.

As described above, according to the present exemplary embodiment, in the power supply apparatus of a configuration for connecting the terminal of the case and the piezoelectric transformer using the conductive rubber, it becomes possible to protect the conductive rubber from the surge current generated when the switching element is turned on, to reduce deterioration of the conductive rubber. According to the present exemplary embodiment, the degradation of the amplitude value of the drive voltage from the switching element can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Applications No. 2008-306502 filed Dec. 1, 2008 and No. 2009-255226 filed Nov. 6, 2009, which are hereby incorporated by reference herein in their entirety.

What is claimed is:

1. A power supply apparatus comprising:
a piezoelectric transformer;
a holding unit that holds the piezoelectric transformer;
a conductive rubber member that connects the holding unit to the piezoelectric transformer;
a drive unit configured to supply a drive signal to the piezoelectric transformer;
an output unit configured to output a high-voltage from the piezoelectric transformer according to the drive signal from the drive unit; and
a current reduction unit configured to reduce a surge current generated when the drive unit is driven,
wherein the current reduction unit includes a resistor and a diode, which are connected between the drive unit and a primary side of the piezoelectric transformer,
wherein the drive unit includes an inductor and a switching element connected in series to the inductor, and
wherein an anode of the diode is connected to a connection point between the inductor and the switching element, a cathode of the diode is connected to the primary side of the piezoelectric transformer, and the resistor is connected in parallel to the diode.

2. The power supply apparatus according to claim 1, further comprising a capacitor that is connected between the cathode of the diode and the primary side of the piezoelectric transformer.

3. The power supply apparatus according to claim 1, wherein a first electrode and a second electrode on the primary side of the piezoelectric transformer are connected to the drive unit, and
wherein the inductor and the first electrode on the primary side of the piezoelectric transformer are connected, an anode of the diode is connected to a connection point between the inductor and the switching element, a cathode of the diode is connected to a second electrode on the primary side of the piezoelectric transformer, and the resistor is connected in parallel to the diode.

4. The power supply apparatus according to claim 3, further comprising a capacitor that is connected between the first electrode and a connection point on a ground side of the switching element.

5. The power supply apparatus according to claim 3, further comprising a capacitor that is connected between the first electrode and the second electrode.

6. The power supply apparatus according to claim 3, wherein a capacitor is connected in parallel between a first electrode and a second electrode of the piezoelectric transformer.

7. The power supply apparatus according to claim 1, wherein the drive unit includes an inductor and a switching element connected in series to the inductor, and
wherein a connection point between the inductor and the switching element and a first electrode on a primary side of the piezoelectric transformer are connected, and
wherein a ground side of the switching element and a cathode of the diode are connected, and
wherein an anode of the diode is connected to a second electrode on the primary side of the piezoelectric transformer, and the resistor is connected in parallel to the diode.

8. An image forming apparatus comprising:
an image forming unit configured to form an image on recording material; and
a power supply unit configured to output a high-voltage to the image forming unit,
wherein the power supply unit includes:
a piezoelectric transformer;
a holding unit that holds the piezoelectric transformer;
a conductive rubber member that connects the holding unit to the piezoelectric transformer;
a drive unit configured to supply a drive signal to the piezoelectric transformer;
an output unit configured to output a high-voltage from the piezoelectric transformer according to the drive signal from the drive unit; and
a current reduction unit configured to reduce a surge current generated when the drive unit is driven, wherein the current reduction unit includes a resistor and a diode, which are connected between the drive unit and a primary side of the piezoelectric transformer, wherein the drive unit includes an inductor and a switching element connected in series to the inductor, and wherein an anode of the diode is connected to a connection point between the inductor and the switching element, a cathode of the diode is connected to the primary side of the piezoelectric transformer, and the resistor is connected in parallel to the diode.

9. The image forming apparatus according to claim 8, wherein the image forming unit includes an image bearing member, a development unit configured to develop a latent image formed on the image bearing member, and a transfer unit configured to transfer an image developed on the image bearing member on the recording material, and wherein a high-voltage output from the power supply unit is supplied to the development unit or the transfer unit.

10. The image forming apparatus according to claim 8, wherein the image forming unit includes an image bearing member, a development unit configured to develop a latent image formed on the image bearing member, and a transfer unit configured to transfer an image developed on the image bearing member on the recording material, and wherein a high-voltage output from the power supply unit is supplied to the development unit or the transfer unit.

11. A power supply apparatus comprising:

a piezoelectric transformer;

a drive unit configured to supply a drive signal to an electrode of a primary side of the piezoelectric transformer;

a conductive rubber member that connects to the electrode of the primary side of piezoelectric transformer, wherein a current flows to the conductive rubber member in a case where the drive unit is driven to supply the drive signal to the electrode of the primary side of the piezoelectric transformer via the conductive rubber member;

an output unit configured to output a high-voltage from the piezoelectric transformer according to the drive signal from the drive unit;

a rectifying element connected to the conductive rubber member and the drive unit; and a resistance element connected to the rectifying element in parallel.

12. The power supply apparatus according to claim 11, wherein the rectifying element is a diode, and wherein the drive unit is connected to an anode of the diode, and the conductive rubber member is connected to a cathode of the diode.

13. An image forming apparatus comprising:

an image forming unit configured to form an image on recording material; and a power supply unit configured to output a high-voltage to the image forming unit, wherein the power supply unit includes:

a piezoelectric transformer;

a drive unit configured to supply a drive signal to an electrode of a primary side of the piezoelectric transformer;

a conductive rubber member that connects to the electrode of the primary side of piezoelectric transformer, wherein a current flows to the conductive rubber member in a case where the drive unit is driven to supply the drive signal to the electrode of the primary side of the piezoelectric transformer via the conductive rubber member;

an output unit configured to output a high-voltage from the piezoelectric transformer according to the drive signal from the drive unit;

a rectifying element connected to the conductive rubber member and the drive unit; and a resistance element connected to the rectifying element in parallel.

14. The image forming apparatus according to claim 13, wherein the rectifying element is a diode, and wherein the drive unit is connected to an anode of the diode, and the conductive rubber member is connected to a cathode of the diode.

* * * * *